US00RE37884E

(19) United States
(12) Reissued Patent
Chen

(10) Patent Number: US RE37,884 E
(45) Date of Reissued Patent: Oct. 15, 2002

(54) TRANSMITTER-RECEIVER SYSTEM FOR USE IN AN AUDIO EQUIPMENT

(75) Inventor: Jinsaun Chen, Chung Ho (TW)

(73) Assignee: Bright Headphone Electronics Co. (TW)

(21) Appl. No.: 09/164,630

(22) Filed: Oct. 1, 1998

Related U.S. Patent Documents

Reissue of:
(64) Patent No.: 5,722,050
Issued: Feb. 24, 1998
Appl. No.: 08/633,644
Filed: Apr. 17, 1996

(51) Int. Cl.[7] ..... H04B 7/00
(52) U.S. Cl. ..... 455/66; 455/42; 455/344
(58) Field of Search ..... 455/66, 42, 344, 455/350, 351, 91, 110, 118, 500, 517, 93, 129, 205; 381/3, 4, 14, 25, 2, 122

(56) References Cited

U.S. PATENT DOCUMENTS 5,553,312 A * 9/1996 Gattey et al. ..... 455/66

FOREIGN PATENT DOCUMENTS

GB 2121649 * 12/1963 ..... 455/42
JP 4-10877 * 1/1992 ..... H04N/5/60

* cited by examiner

*Primary Examiner*—Nguyen T. Vo
(74) *Attorney, Agent, or Firm*—Donald C. Casey, Esq.

(57) ABSTRACT

A transmitter-receiver system including a transmitter unit installed in an audio equipment, and a receiver unit installed in an earphone, wherein the transmitter unit includes an automatic electric level regulator to regulate the electric level of the output signal of audio equipment to a predetermined range, a power control circuit controlled by the output signal of the audio equipment to provide the necessary working voltage, and an inductance antenna to transmit output signal from the audio equipment to the receiver unit; the receiver unit is of low working voltage design, including an automatic 24-time frequency divider circuit to effectively discriminate left and right sound tracks, and an auto-shut off circuit to automatically cut off power supply when the audio equipment does no work; the transmitter unit and the receiver unit further use a respective dual oscillation frequency regulating circuit consisting of an oscillating transistor, a dielectric resonator, and two variable resistors for regulating the range of the frequency.

6 Claims, 2 Drawing Sheets

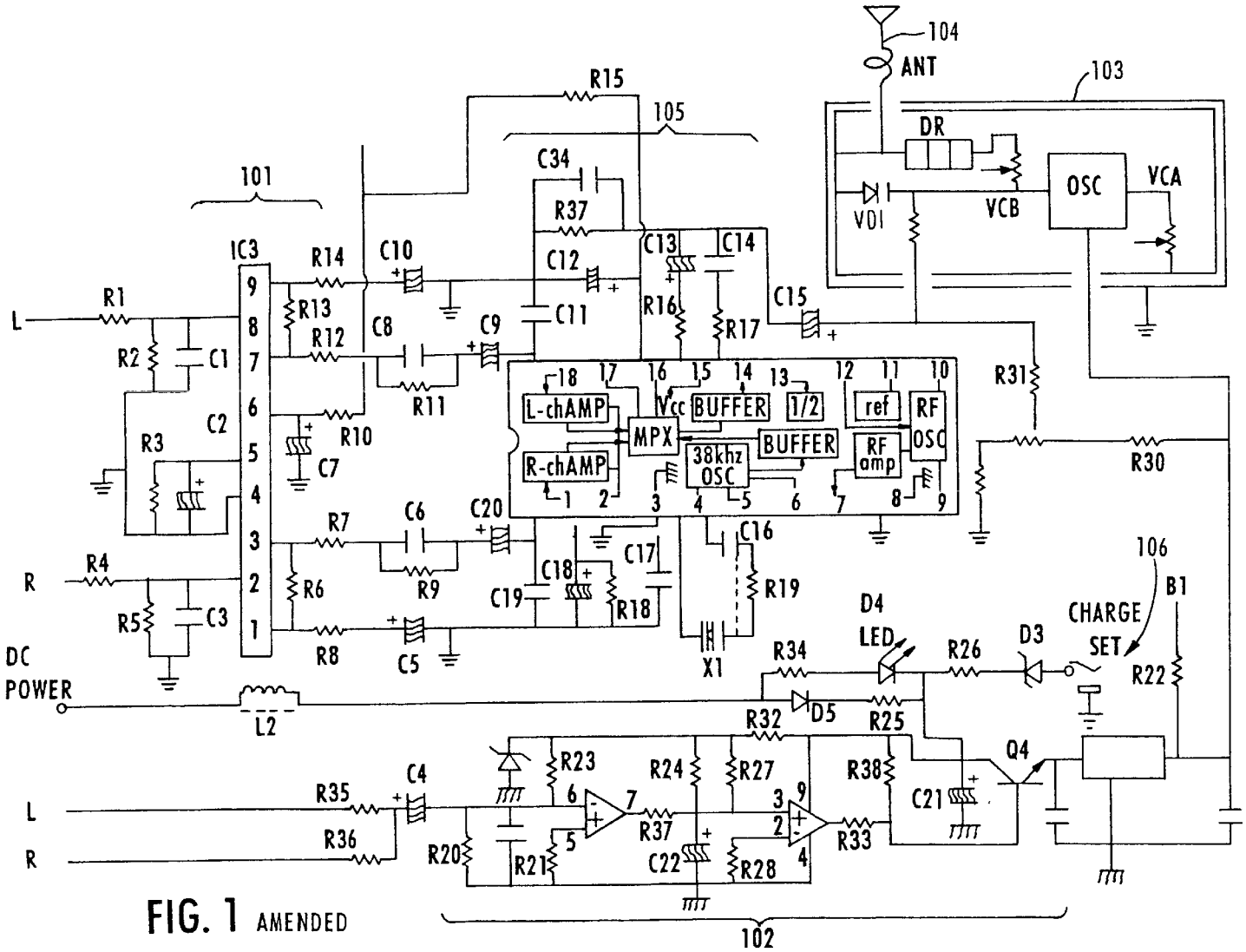
FIG. 1 AMENDED

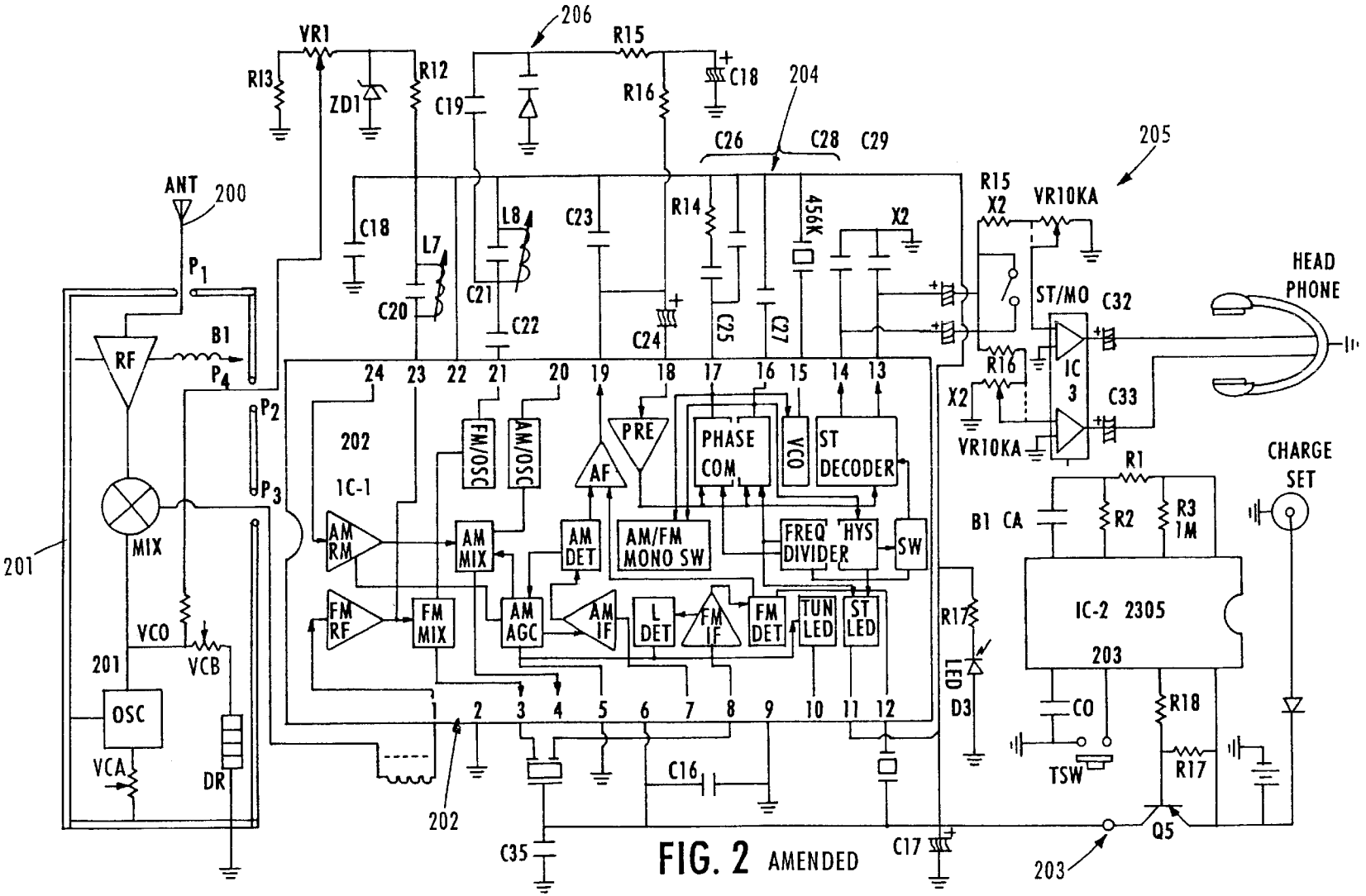
FIG. 2 AMENDED

TRANSMITTER-RECEIVER SYSTEM FOR USE IN AN AUDIO EQUIPMENT

Matter enclosed in heavy brackets [ ] appears in the original patent but forms no part of this reissue specification; matter printed in italics indicates the additions made by reissue.

BACKGROUND OF THE INVENTION

The present invention relates to a transmitter-receiver system for use in an audio equipment which comprises a transmitter unit installed in the audio equipment to transmit its output signal, and a receiver unit installed in an earphone to receive transmitted signal from the transmitter unit.

In order not to interfere with others while listening the music of an audio equipment, an earphone shall be used. However, when an earphone is used and connected to the output terminal of the audio equipment, the limitation of the length of the electric wire of the earphone, the movement of the user is confined to a limited area. Furthermore, when an audio equipment is installed, the electric wires between the amplifier and the speakers may be disorderly exposed to the outside. If to keep the electric wires from sight, the installation cost of the audio equipment will be high.

SUMMARY OF THE INVENTION

The present invention has been accomplished to provide a transmitter-receiver system which eliminates the afore said problems. It is one object of the present invention to provide a transmitter-receiver system which can be installed in the amplifier and speakers of an audio equipment so that the sound signal of the amplifier can be transmitted to the speakers for output wirelessly. It is another object of the present invention to provide a transmitter-receiver system which can be installed in an audio equipment and an earphone so that the user can listen to the music of the audio equipment without interfering then *with* other persons. It is still another object of the present invention to provide a transmitter-receiver system which eliminates the use of a [complidated] *complicated* matching device by using an inductance type transmitting antennae which reduces the floating frequency. It is still another object of the present invention to provide a transmitter-receiver system which consumes low voltage. It is still another object of the present invention to provide and transmitter-receiver unit which automatically cuts off battery power supply when the audio equipment does [no] *not* work. It is still another object of the present invention to provide a transmitter-receiver unit which adopts a dual oscillation frequency regulating circuit for the transmitter unit as well as the receiver unit so that the range of frequency can be broadly adjusted without being limited by the installation of a SAW [did] in conventional methods in which the output of the first intermediate frequency can be within the range of 10.7MH to 100MH; the second frequency mixing and the second local oscillation may be eliminated when desired. It is still another object of the present invention [which allows] *to allow* the user (consumer) to [charge] *change* the frequency of the first local oscillation through VR1 without changing the frequency of the second local oscillation.

According to the preferred embodiment of the present invention[.] the transmitter unit comprises an automatic electric level regulator to regulate the electric level of the output signal of audio equipment to a predetermined range[.], a power control circuit controlled by the output signal of the audio equipment to provide the necessary working voltage[.], and an inductance antennae to transmit *an* output signal from the audio equipment to the receiver unit. The receiver unit comprises an automatic 24-time frequency divider circuit to effectively discriminate left and right sound tracks[. and], *an* auto-shut off circuit to automatically to cut off *the* power supply when the audio equipment does *not* work. Furthermore, the transmitter unit and the receiver unit further use a respective *external and internal* dual [oscillation] *oscillatory* frequency regulating circuit consisting of an oscillating transistor[.], a dialectic resonator[.], and two variable resistors for regulating the range of the frequency.

BRIEF DESCRIPTION OF THE DRAWINGS

FIG. 1 is a circuit diagram of the transmitter unit of the transmitter-receiver system of the preferred embodiment of the present invention; and FIG. 2 is a circuit diagram of the receiver unit of the transmitter-receiver system of the preferred embodiment of the present invention.

DETAILED DESCRIPTION OF THE PREFERRED EMBODIMENT

A transmitter-receiver system in accordance with the present invention is comprised of a transmitter unit installed in the mainframe of an audio equipment, and a receiver unit installed in an earphone. FIG. 1 shows the circuit of the transmitter unit. FIG. 2 shows the circuit of the receiver unit.

Referring to FIG. 1, the automatic electrical level regulator, referenced by 101, is comprised of an electrical level regulating integrated circuit IC3. When the output signal of the main frame of the audio equipment is received, it is transmitted to the input terminal of the electrical level regulator IC3, which regulates the electrical level of the signal to a standard level and then sends the regulated signal to a posterior signal processing circuit. As the signal processing circuit is not within the scope of the present invention, it is not described in detail. The power control circuit referenced by 102, is comprised of a comparator and transistor. When the comparator of the power control circuit 102 receives a signal, the comparator of the power control circuit 102 immediately turns on the transistor, permitting external power supply to be connected to the transmitter unit, to provide it with the necessary working voltage. When the comparator of the power control circuit 102 receives no signal, it immediately turns off the transistor. The dual oscillation frequency regulating circuit referenced by 103 is comprised of an oscillating transistor OSC, a dialectical resonator DR, *a variable capacitor diode VD1,* and two variable resistors VCA, VCB. The input terminal of the oscillation frequency regulating circuit 103 is connected to the output terminal of the afore said signal processing circuit *105* and the output terminal thereof is connected to the inductance antennae referenced by 104. The inductance antennae 104 itself is a matching device, therefore no [any] external matching device is needed.

Referring to FIG. 2, the receiver unit comprises an oscillation frequency regulating circuit *201* (See the left side of FIG. 2). The structure of the input terminal of the oscillation frequency regulating circuit *201* is identical to that of the transmitter unit. The input terminal of the oscillation frequency regulating circuit *201* is connected to the receiving antennae *200* and the output terminal thereof is connected to the signal processing circuit *202* of the receiver unit. A signal processing circuit *202* of the receiver unit is comprised of an integrated circuit IC-1. The 24 time frequency divider circuit, referenced by 204, is comprised of a resistor R14, capacitor C25, C26, C27, C28, C29 and oscillator[, and] *which is* connected to the signal processing circuit IC-1 to divide the frequency of the output signal of the signal processing circuit IC-1 by 24 so as to provide a 18 KHz three dimensional demodulated signal of better left, right, sound track discrimination. When the output signal of the signal processing circuit is amplified, it is provided to the [speaker of] earphone *speaker*. The auto shut-off circuit *203* is comprised of an integrated circuit IC-2 and a transistor Q5. The transistor Q5 is controlled by the integrated circuit IC-2 to [turned on/off] *turn the* external power supply or battery power supply *on/off*. The integrated circuit IC-2 can automatically cut off *the* power supply after a predetermined length of time. The working voltage of the receiver unit is designed at a low level of about 2.1–3.5V so that battery power consumption can be minimized.

It is to be understood that the drawings are designed for purposes of illustration only, and are not intended as a definition of the limits and scope of the invention disclosed.

What the invention claimed is:

1. A transmitter-receiver system comprising a transmitter unit installed in an audio equipment, and a receiver unit installed in an earphone, wherein:

said transmitter unit comprises:

an automatic electric level regulator, said automatic electric level regulator comprised of an electrical regulating IC, having an input terminal connected to the output terminal of said audio equipment to regulate the electric level of the output signal of said audio equipment to a predetermined range, and an output terminal;

a signal processing circuit having an input terminal connected to the output terminal of said automatic electric level regulator, and an output terminal;

a dual oscillation frequency regulating circuit, said dual oscillation frequency regulating circuit comprised of an oscillating transistor, a dielectric resonator, a first variable resistor, and a second variable resistor, having an input terminal connected to the output terminal of said signal processing circuit, and an output terminal, a first intermediate frequency output being within 10.7 MH to 100 MH and adjusted by said first variable resistor;

an inductance antenna connected to the output terminal of said dual oscillation frequency regulating circuit, said inductance antenna being a matching device; and a power control circuit controlled by the output signal of said audio equipment to provide the necessary working voltage to said transmitter unit, said power control circuit comprised of a comparator and a transistor, said comparator turning on said transistor when receiving a signal from said audio equipment, permitting external power supply to be connected to said transmitter unit;

said receiver unit comprises:

a receiving antenna to receive radio signal transmitted from said inductance antenna of said transmitter unit;

a dual oscillation frequency regulating circuit, the dual oscillation frequency regulating circuit of said receiver unit comprised of an oscillating transistor a dielectric resonator, and two variable resistors, having an input terminal connected to the output terminal of said receiving antenna, and an output terminal;

a signal processing circuit connected to said oscillation frequency regulating circuit of said receiver unit to process received signal and to provide processed signal to said earphone;

an automatic 24-time frequency divider circuit, said automatic 24-time frequency divider circuit comprised of a resistor and an oscillator and connected to an IC of the signal processing circuit of said receiver unit to divide the frequency of received signal by 24, so as to provide a 19 KHz three-dimensional demodulated signal; and an auto-shut off circuit, said auto-shut off circuit comprised of an IC and a transistor, said transistor of said auto-shut off circuit being controlled by the IC of said auto-off circuit to turned on/off external power supply.

*2. A transmitter for a wireless transmitter-receiver system wherein the transmitter is coupled to audio equipment having an input terminal and an out put terminal to transmit an audio signal therefrom comprising:*

*an automatic audio level regulating circuit comprised of an audio regulating IC, having an input terminal adapted to be connected to the output terminal of said audio equipment to regulate the audio level of an output signal from said audio equipment to a predetermined range, and an output terminal;*

*a signal processing circuit having an input terminal connected to the output terminal of said automatic audio level regulating circuit, and an output terminal;*

*a dual adjustable oscillatory frequency regulating circuit comprising an oscillator transistor, and dielectric resonator, a first variable resistor, a second variable resistor and a variable capacitor diode, an input terminal connected to the output terminal of said signal processing circuit, and an output terminal, a carrier frequency output being adjusted and set by said first and second variable resistors;*

*an inductance antenna connected to the output terminal of said dual adjustable oscillatory frequency regulating circuit, said inductance antenna being a matching device; and*

*a power control circuit controlled by the output signal of said audio equipment to provide the necessary working voltage to said transmitter, said power control circuit comprising a signal amplifier, a comparator and a transistor switch, so that when said signal amplifier receives an input signal from said audio equipment it drives said comparator and transistor switch permitting the connection of an external power supply or battery supply to said transmitter.*

*3. A receiver for a wireless transmitter-receiver system wherein the system transmitter includes an inductance antenna and is adapted to be coupled to audio equipment to transmit an audio signal therefrom through an inductance antenna comprising:*

*a receiving antenna adapted to receive an audio signal transmitted from the inductance antenna of said transmitter;*

*a dual adjustable oscillatory frequency regulating circuit comprising an oscillatory transmitter, a dielectric resonator, and a first variable resistor, a second variable resistor, and a variable capacitor diode, an input terminal connected to the output terminal of said receiving antenna, and an output terminal;*

*a signal processing circuit connected to said dual adjustable oscillatory frequency regulating circuit to process received signals and to provide a processed signal to said receiver;*

*an automatic 24-time frequency divider circuit comprising a resistor and an oscillator, connected to a first IC of said receiver signal processing circuit to divide the frequency of said received signal by 24, so as to provide a 19 KHz three-dimensional demodulated signal;*

*and an auto-shut off circuit comprising a second IC and a transistor, said transistor being controlled by said second IC to turn a power supply on/off.*

*4. The receiver of claim 3, wherein said external and internal dual adjustable oscillatory frequency regulating circuit has a first intermediate frequency of at least above 10 MhZ.*

*5. The receiver of claim 3 wherein said external and internal dual adjustable oscillatory frequency regulating circuit provides a local oscillatory frequency that can be broadly adjusted without a conventional SAW and which adjusts a first local oscillatory frequency and fixes a second oscillatory frequency.*

*6. The receiver of claim 3 wherein said auto-shutoff circuit can automatically turn on said receiver when it receives an audio signal and automatically turn off said receiver when it receives no audio signal after a predetermined period of time.*

* * * * *

UNITED STATES PATENT AND TRADEMARK OFFICE

CERTIFICATE OF CORRECTION

PATENT NO. : RE 37,884 E
DATED : October 15, 2002
INVENTOR(S) : Jinsaun Chen

It is certified that error appears in the above-identified patent and that said Letters Patent is hereby corrected as shown below:

Column 3,
Line 5, "18Khr" should read -- 19Khr --

Signed and Sealed this

Twenty-first Day of September, 2004

JON W. DUDAS
*Director of the United States Patent and Trademark Office*